(12) United States Patent
Gilleo et al.

(10) Patent No.: US 6,194,788 B1
(45) Date of Patent: Feb. 27, 2001

(54) FLIP CHIP WITH INTEGRATED FLUX AND UNDERFILL

(75) Inventors: Kenneth Burton Gilleo, Cranston, RI (US); David Blumel, New York, NY (US)

(73) Assignee: Alpha Metals, Inc., Jersey City, NJ (US)

(*) Notice: Subject to any disclaimer, the term of this patent is extended or adjusted under 35 U.S.C. 154(b) by 0 days.

(21) Appl. No.: 09/266,232

(22) Filed: Mar. 10, 1999

(51) Int. Cl.[7] .......................... H01L 23/29; H01L 23/495
(52) U.S. Cl. .......................... 257/789; 257/673; 257/738; 257/783; 257/793
(58) Field of Search ..................... 257/787, 788, 257/789, 792, 793, 794, 673, 738, 783

(56) References Cited

U.S. PATENT DOCUMENTS

| | | | |
|---|---|---|---|
| 5,128,746 | 7/1992 | Pennisi | 257/738 |
| 5,641,996 * | 6/1997 | Omoya et al. | 257/787 |
| 5,814,401 | 9/1998 | Gamota et al. | 428/343 |

FOREIGN PATENT DOCUMENTS

| | | |
|---|---|---|
| 0969060 | 1/2000 | (EP) . |
| WO 97 07541 | 2/1997 | (WO) . |
| WO 98 37314 | 8/1998 | (WO) . |
| WO 99/04430 | 1/1999 | (WO) . |

* cited by examiner

*Primary Examiner*—Cathy Lam
(74) *Attorney, Agent, or Firm*—Mintz, Levin, Cohn, Ferris, Glovsky and Popeo, P.C.

(57) ABSTRACT

A flip chip having solder bumps and an integrated flux and underfill, as well as methods for making such a device, is described. The resulting device is well suited for a simple one-step application to a printed circuit board, thereby simplifying flip chip manufacturing processes which heretofore have required separate fluxing and underfilling steps.

9 Claims, 1 Drawing Sheet

FLIP CHIP WITH INTEGRATED FLUX AND UNDERFILL

FIELD OF THE INVENTION

The present invention relates to a novel flip chip design. More particularly, the present invention relates to a flip chip which incorporates solder bumps, flux and an underfill material, wherein the flux and underfill are provided by a single material capable of providing both flux and underfill properties.

BACKGROUND OF THE INVENTION

In the electronics industry, electrical components such as resisters, capacitors, inductors, transistors, integrated circuits, chip carriers and the like are typically mounted on circuit boards in one of two ways. In the first way, the components are mounted on one side of the board and leads from the components extend through holes in the board and are soldered on the opposite side of the board. In the second way, the components are soldered to the same side of the board upon which they are mounted. These latter devices are said to be "surface-mounted."

Surface mounting of electronic components is a desirable technique in that it may be used to fabricate very small circuit structures and in that it lends itself well to process automation. One family of surface-mounted devices, referred to as "flip chips", comprises integrated circuit devices having numerous connecting leads attached to pads mounted on the underside of the device. In connection with the use of flip chips, either the circuit board or the chip is provided with small bumps or balls of solder (hereafter "bumps" or "solder bumps") positioned in locations which correspond to the pads on the underside of each chip and on the surface of the circuit board. The chip is mounted by (a) placing it in contact with the board such that the solder bumps become sandwiched between the pads on the board and the corresponding pads on the chip; (b) heating the assembly to a point at which the solder is caused to reflow (i.e., melt); and (c) cooling the assembly. Upon cooling, the solder hardens, thereby mounting the flip chip to the board's surface. Tolerances in devices using flip chip technology are critical, as the spacing between individual devices as well as the spacing between the chip and the board is typically very small. For example, spacing of such chips from the surface of the board is typically in the range of 0.5–3.0 mil and is expected to approach micron spacing in the near future.

One problem associated with flip chip technology is that the chips, the solder and the material forming the circuit board often have significantly different coefficients of thermal expansion. As a result, differing expansions as the assembly heats during use can cause severe stresses, i.e., thermomechanical fatigue, at the chip connections and can lead to failures which degrade device performance or incapacitate the device entirely.

In order to minimize thermomechanical fatigue resulting from different thermal expansions, thermoset epoxies have been used. Specifically, these epoxies are used as an underfill material which surrounds the periphery of the flip chip and occupies the space beneath the chip between the underside of the chip and the board which is not occupied by solder. Such epoxy systems provide a level of protection by forming a physical barrier which resists or reduces different expansions among the components of the device.

Improved underfill materials have been developed in which the epoxy thermoset material is provided with a silica powder filler. By varying the amount of filler material, it is possible to cause the coefficient of thermal expansion of the filled epoxy thermoset to match that of the solder. In so doing, relative movement between the underside of the flip chip and the solder connections, resulting from their differing coefficients of thermal expansion, is minimized. Such filled epoxy thermosets therefore reduce the likelihood of device failure resulting from thermomechanical fatigue during operation of the device.

While underfill has solved the thermal mismatch problem for flip chips on printed circuit boards, it has created significant difficulties in the manufacturing process. For example, the underfill must be applied off-line using special equipment. Typically, the underfill is applied to up to three edges of the assembled flip chip and allowed to flow all the way under the chip. Once the material has flowed to opposite edges and all air has been displaced from under the chip, additional underfill is dispensed to the outer edges so as to form a fillet making all four edges symmetrical. This improves reliability and appearance. Next, the assembly is baked in an oven to harden the underfill. This process, which may take up to several hours, is necessary to harden and fully cure the underfill. Thus, although the underfill solves the thermal mismatch problem and provides a commercially viable solution, a simpler manufacturing method would be desirable.

Recently, attempts have been made to improve and streamline the underfill process. One method that has shown some commercial potential involves dispensing underfill before assembling the flip chip to the board. This method requires that the underfill allow solder joint formation to occur. Soldering of flip chips to printed circuit boards is generally accomplished by applying flux to the solder bumps on the flip chip or to the circuit pads on the printed circuit board. Thus, it has been suggested to use an underfill that is dispensed first, prior to making solder connections. In order to facilitate solder bonding, however, the underfill must contain flux or have inherent properties that facilitate solder joint formation. Flux is used since the pads on printed circuit boards often oxidize, and since solder bumps on flip chips are always oxidized. Thus, the flux is designed to remove the oxide layers facilitating solder joint formation.

Certain underfills commonly called "dispense first underfills" have been designed with selfcontained flux chemistry. Unfortunately, the properties required for a good flux and those required for a good underfill are not totally compatible. As such, a compromise of properties results. The best flux/underfill materials typically require more than an hour to harden.

Additionally, flux-containing underfills still require the use of special equipment including robot dispensing machines. Also, since solder assembly and underfill application are combined into a single step, the flip chip cannot be tested until the assembly is complete. Thus, if the chip does not operate satisfactorily, it cannot be removed because the underfill will have hardened, thereby preventing reworking.

Finally, certain problems have been found to arise when applying flux/underfill materials to bumped surfaces of flip chips. The problems result because the rough surface geometry of the bumped surface is not readily amenable to the application of fluids, particularly those having high viscosity. Thus, providing the flux/underfill directly onto a bumped surface raises at least the possibility of discontinuities and air bubbles forming during the flux/underfill application process. Furthermore, by eliminating bumping prior to application of the flux/underfill layer, it may be possible to eliminate process steps, thereby streamlining the manufacturing process while providing chip makers with greater design and manufacturing flexibility.

In view of the above, a need still exists for a more efficient process that reduces the need for expensive equipment and that is compatible with existing electronic device assembly lines. A need for a reworkable underfill also exists. A further need exists for a flux/underfill material that can harden quickly while offering both excellent fluxing properties and excellent underfill properties.

SUMMARY OF THE INVENTION

The present invention relates to an integrated circuit assembly comprising a semiconductor wafer which includes solder bumps and an underfill material which also has fluxing properties. In a broad sense, the invention relates to an integrated circuit assembly which includes a substrate having a plurality of solderable contact sites on one surface and a plurality of solder bumps positioned on that surface such that each of the solderable contact sites has one solder bump associated with and affixed to each solderable contact site. Each site further includes an underfill material which occupies the space defined between each of the solder bumps. The underfill material is characterized in that it also offers fluxing properties when heated to the process temperatures at which chips formed from the wafer are affixed to circuit boards and the like. Unlike previous methods in which it was desirable to have portions of the solder bumps extend through the underfill to allow flux to be applied, in the present invention, the underfill material may completely cover the solder bumps since the underfill material itself acts as a flux.

The present invention also relates to a method for making an integrated circuit assembly which includes the steps of providing a substrate having a plurality of solderable contact sites on a surface thereof and a wafer having solder bumps applied to one surface. An underfill material is applied to the surface of the wafer having the solder bumps. The resulting wafer is characterized in that the underfill occupies the space defined between each of the solder bumps and also covers the bumps, thereby providing a flux on the portion of each solder bump which will be contacted with a substrate during chip mounting.

Lastly, the invention relates to a process for affixing a flip chip to a circuit board. The method involves providing a printed circuit board having a plurality of solderable contact sites on a surface, providing an integrated circuit chip of the type described above (i.e., a chip having solder bumps and a flux-integrated underfill material present on its surface), and positioning the integrated circuit chip relative to the printed circuit board such that each solder bump is in contact with a solderable contact site on the printed circuit board. Once positioned, the integrated circuit chip assembly is heated to a temperature sufficiently high to melt the solder and the underfill material. Molten portions of the underfill provide fluxing properties for the solder. Subsequently, the assembly is allowed to cool to a temperature which allows the solder and underfill material to solidify.

DETAILED DESCRIPTION OF THE INVENTION

Figure 1:
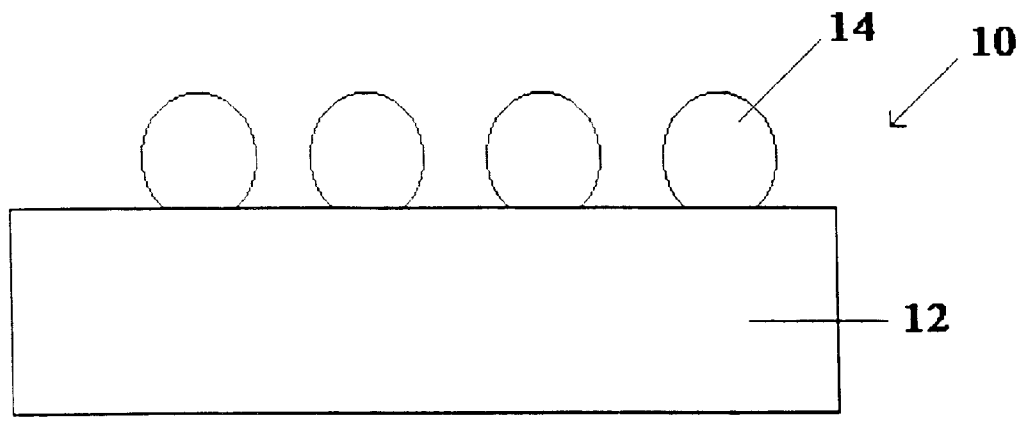
FIG. 1 is a schematic representation of a portion of a semiconductor wafer having solder bumps applied to its surface.

The present method provides a unique method of applying and underfill to a flip chip wafer. In particular, in the present invention, a coatable solution of solid materials is applied to a flip chip that has solder bumps already attached to the integrated circuit connection pads. The material is made up of one or more epoxy resins, such as the preferred bisphenol A, and one or more hardeners that have fluxing properties. Such fluxing properties include primarily the ability to reduce metal oxides found on printed circuit conductor pads and on the surface of solder and bare metal. The hardeners are selected from the chemical classes of carboxylic acids and acid anhydrides. The hardener may be one or more materials selected from one or both of these classes. Thus, the hardener may be a mixture of several carboxylic acids and several acid anhydrides.

Other additives, such as wetting agents, thixotropic agents, tackifiers, polymerization catalysts, polymerization inhibitors, low levels of cross-linking agents, conventional fluxes and solvents may also be used.

The underfill material is further provided with a predetermined amount of an appropriate filler to provide the underfill with a coefficient of thermal expansion (CTE) that approximates that of the solder joints which will be formed by the bumps. A mineral filler such as silicon dioxide is preferred. The preferred CTE of the resulting underfill material is approximately 25 ppm/° C., although values of up to about 45 ppm/° C. are also envisioned. Even after processing the CTE of the underfill cannot become greater than about 60 ppm/° C., because this can cause detrimental thermomechanical stresses at the solder joints. The preferred filler material is spherical and has a diameter less than the high of the solder bumps that will be applied to the wafer. Thus, as typical filler ranges in size from about 3 microns to about 15 microns. While silicon dioxide is preferred because of its ready availability, other non-electrically conductive materials such as aluminum nitride, aluminum oxide and beryllium oxide can be use as well.

A solvent, or solvent blend, which is compatible with each of the components is selected. Among the suitable solvents are included many common oxygenated, nitrogen-containing solvents as well as many polar aromatic solvents. The particular solvent system chosen should have evaporation and boiling points that allow removal of the solvent in the environment of a drying oven once the wafer is coated with the underfill material.

In one embodiment of the present invention, the flux/underfill material should provide an underfill which is reworkable following chip mounting. As such, the resulting underfill material must be a thermoplastic or a thermoset with a relatively low cross-link density. In contrast, convention underfills are typically highly cross-linked polymers that cannot be softened, postmounting, to allow removal or reworking of a faulty chip. Of course, while a reworkable underfill is desirable in one embodiment of the present invention, it should be understood that the invention is not intended to be limited as such. Rather, a permanent thermoset composition, achieved by adding hardeners that produce substantial cross-linking may be used as well. Such non-reworkable underfills offer potential for use in applications in which high operational temperatures are likely, such as in automotive and aerospace applications.

The underfill solution can be formulated to have the correct rheology for application to the wafer using any of a number of methods. For example, since the ratio of solvent to solids in the solution determines the viscosity of the solution, it is possible to formulate underfill solutions that can be applied using different methods. Since the solvent is substantially entirely evaporated after application of the underfill solution to the wafer, the resulting, solid underfill layer can have the composition regardless of the initial viscosity and percent solids of the underfill solution. This results because the solvent acts simply as a vehicle for carrying the solids during underfill application.

In one method, the underfill solution can be applied by spin coating, a common semiconductor processing method in which liquid is deposited onto a spinning wafer in order to provide a smooth and level coating. An underfill having a viscosity in the range of about 80–85 Kcps, measured at 2.5 RPM using an RVT #6 spindle on a Brookfield viscometer, has been found to give good results. When applied to a wafer, a wafer spin rate of about 1200 RPM yields a smooth coating.

A second method is stencil printing. This method requires a more viscous material that is produced using less solvent. The thixotropic index, (i.e., change in viscosity as a result of mechanical shearing), can also be adjusted, using thixotropic additives, to improve printing characteristics. The thickness of the stencil determines the amount of material applied to the wafer. That notwithstanding, the stencil should be thicker than the bump height so that the blade applying the underfill material does not contact the bumps. If such contact does occur, damage to the bumps or even displacement of the bumps may occur.

It is preferred that the thickness of the dried underfill material be less than the height of the solder bumps to allow for collapse of the bumps during the attachment process. In one preferred embodiment, the dried underfill material will have a height in the range of about 50–80%, and more preferably, about 60–70% that of the bumps. The amount of solvent contained in the underfill solution determines the amount of thickness reduction that occurs in the underfill during drying and solvent evacuation. Thus, it is necessary to consider both the stencil thickness and the solvent percent of the underfill solution in order to precisely control the thickness of the applied underfill. A dry underfill thickness range of about 25 to about 125 microns is suitable and will depend on the height of the bumps to be produced at a later stage.

It should be understood that while spin coating and stencil printing are preferred, many other methods can be used to apply the underfill to the layer. These include, but are not limited to, needle deposition, spraying, screen printing and others.

Alternatively, the coating composition can be cast onto a release paper and then dried into a film. The resulting, meltable film can be cut into a proper shape, called a preform, and applied to the wafer. Heating, with the application of pressure, will cause the underfill layer to bond to the wafer. Mild heating would cause the film to melt and bond to the wafer without activating the fluxing properties or causing polymerization. One advantage of a solid film is that it can be easily shipped, conveniently stored, and applied by simple mechanical handling equipment.

Unlike systems which employ a separate flux and underfill, the present system allows the underfill material to cover the solder bumps since it offers fluxing properties as well as underfill properties. In fact, it is preferred that the material cover the bumps because, in so doing, the bumps will be protected from oxidation, contamination and mechanical damage. Each of the application methods described above has the capability of covering the bumps with the underfill material.

The coating is then dried by heating it in an oven or by direct heating of the wafer. It has been found to be advantageous to heat the wafer while simultaneously using a forced hot air oven to help drive solvent out of the coating. Combined top and bottom heating can eliminate any tendency to trap solvent in the underfill layer by a process known as "skinning" in which the surface of the underfill material dries prematurely and forms a film (i.e., a skin) that acts as a barrier to further solvent evacuation. If drying is carried out properly, the resulting underfill material is non-tacky and amenable to handling.

In some cases, it may be desirable to allow the underfill material to maintain a slight degree of tackiness. For example, a tacky surface may be used to hold a chip in position prior to the solder reflow process. In these instances, tackiness may be provided by adding a tackifier to the composition.

At this stage, the wafer is ready to be diced, or singulated, to produce individual flip chips. Any of a wide variety of the methods known in the art for dicing wafers can be employed to that end.

The sole requirement of the inventive wafers is that the process be such that it does not interfere with the underfill material applied to the wafer/chip surfaces. In one embodiment, dicing can be achieved by attaching the wafer to a holding tape and then sectioning the wafer using a DISCO saw operating at a speed of about 30,000 rpm using a 5 micron diamond. Water jet cooling is used to keep the temperature at the cut below the softening point of the film. The individual die or chip can then be picked off the tape and placed into waffle packs, tape and reel packaging, or other convenient die presentation systems used in the industry.

Once diced, individual flip chips may now be bonded to circuit boards and the like. The flip chip is placed and aligned to the bond pads of a substrate. As used herein, the term "substrate" is intended to mean a circuit board, a chip carrier, another semiconductor device or a metal lead frame. It is not necessary to add flux, although flux may be added for special reasons such as compensating for excessive oxide on substrate pads, or the need to hold the flip chip in place during assembly.

The positioned chip is then run through a solder reflow line commonly used for assembly. A multi-zone oven, with individual heat controls that permit a heating profile is preferred. The flux melts at a temperature ranging from about 80° C. to about 140° C. The melting point is determined by selecting fluxes having epoxy resins with the appropriate melting point. The flux/hardener, formed of one or more carboxylic acids, one or more acid anhydrides, or a combination of both, reduces oxides present on the solder or the metal surface in contact with the solder and allows solder joints to form at the substrate pads. The liquefied flux/underfill also wets the substrate and begins to bond. As the ambient temperature increases, (by moving the assembly into hotter oven zones), the flux-hardener reacts with the epoxy resins to form a mostly linear, or thermoplastic, polymer with a final softening point of at least 130° C. and up to about 190° C. The final softening point is determined by the melting point of the initial resins and the particular type or hardener selected. The final temperature should be selected so that it is not so low that the underfill material softens during device use, nor should it be so high as to result in excessive reworking temperatures.

In one embodiment, a small amount of a multifunctional hardener, i.e., a cross-linking agent, can be added to further increase the softening point of the resulting underfill. It is desirable, however, to keep the softening point low enough so that the resulting underfill can still be softened upon heating to allow the flip chip to be removed. In contrast, if reworkability is not required, and if the work environment of the chip is expected to be subject to high temperatures, a fall thermosetting system can be employed. This can be achieved by adding a substantial amount of cross-linking agent or through the use of multifunctional resins and hardeners.

The heating process, used in the reflow-soldering step, converts the wafer-layer material from a flux to an underfill. The entire process takes place in the reflow oven. As such, the present invention allows the use of standard surface mount technology without the added equipment or added steps that are required for conventional flip chip underfill processes.

Alternatively, a standard flip chip bonder that can apply heat and pressure can be employed instead of the reflow oven. In that embodiment, the flip chip coated with the flux/underfill is placed into contact with the conductive pads on the circuit board and heat from the bonder head will activate the flux, form joints by reflowing the solder bumps, and cause the underfill and flux system to bond tightly to the board. The use of a standard flip chip bonder would allow a flip chip to be assembled to a board that already contained mounted components. This method could also be used to assemble a chip at a site that is being reworked.

Reworking is desirable in situations in which a chip mounting step has failed to properly position the chip on the board. Specifically, the assembly of fine pitch, high-density components can result in misalignments and failed connections. Furthermore, since it is difficult to fully test an unpackaged device such as a flip chip, it becomes desirable to be able to remove the chip if final testing indicates that the chip is not operating optimally, either through a fault with the chip or as a result of improper mounting. Thermoset underfills do not allow the assembly to be reworked since thermosets cannot be melted once they have crosslinked.

The present invention eliminates the problems associated with thermoset underfills by incorporating a thermoplastic resin as the main component of the underfill. Thus, the chip can be removed by raising the chip temperature to above the melting point of the solder (approximately 183° C. for tin/lead solder) and above the de-bonding temperature of the underfill resin.

Typically, the rework temperature must be above the solder reflow temperature, but less than 25 about 220° C. depending on the circuit substrate. An average rework temperature would be about 200° C. The temperature can be higher if localized heat is used; for example, in an alternate embodiment, a chip bonder could be used to remove chips from a substrate post-bonding. In still another embodiment, the underfill may also include a B-staged thermoset that will de-polymerize at an elevated temperature.

Figure 2:
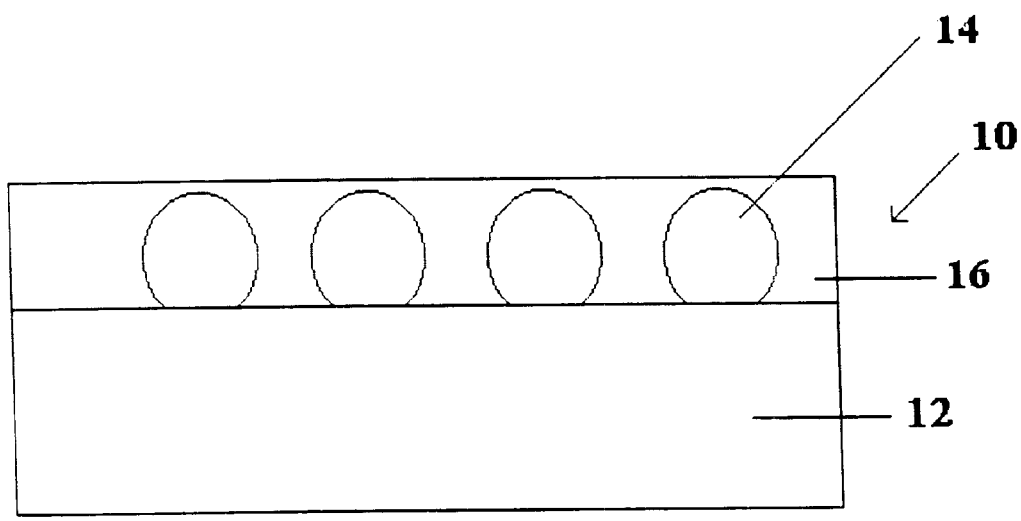
FIG. 2 is a schematic representation of a portion of a semiconductor wafer having solder bumps applied to its surface and a flux/underfill material applied over the solder bumps.

The invention can be further understood with reference to the attached Figures. As can be seen schematically in FIG. 1, a semiconductor device 10 comprises a portion of a semiconductor wafer 12 having solder bumps 14 applied to its surface. Subsequently, as represented schematically in FIG. 2, the device 10 has had a flux/underfill material 16 applied to the surface of the wafer 12 having the solder bumps 14. The underfill material 16 occupies at least the spaces between the bumps 14 and also covers the bumps.

The following Examples will help to illustrate the invention further.

EXAMPLES

Exarnle 1
Flux/underfill Preparation 20.4% by weight bisphenol A epoxy resin (Ciba, GT7074) was blended with 24.4% by weight dipropylene glycol methyl ether acetate (Dow). 0.7% by weight polyamide thixotropic agent (King Industries, Disparlon 6650) was dispersed in the epoxy resin solution at 65° C. for 15 minutes. The blend was cooled to 25° C. and 5.4% by weight 1,4-cyclohexane dicarboxylic acid, 0.4% by weight 2,4,6-triamino pyrimidine, 48.5% by weight 5-micron silica filler (LE-05, from Tatsumori Ltd., Tokyo, Japan), and 0.2% by weight epoxy silane (TS-100 from OSI Specialties, Friendly, W.V.), were dispersed in the blend at high shear.

Example 2
Flux/Underfill Preparation

This material was prepared in a manner similar to that of Example 1, however, 25% by weight bisphenol A and 20% by weight dipropylene glycol methyl ether acetate, were substituted for those amounts provided above. 2% by weight hydrogenated castor oil was substituted for the polyamide thixotropic agent. Additionally, following the cooling step, the additives of Example 1 were substituted with the following: 10% by weight adipic acid, 2% by weight 2,4,6-triamino pyrimidine, 40.9% by weight 5-micron silica filler and 0.1% by weight silane.

Example 3
Flux/Underfill Preparation

This material was prepared in a manner similar to that of Example 1, however, 40% by weight bisphenol A epoxy resin (Shell, Epon 1007F) and 45% by weight dipropylene glycol methyl ether acetate, were substituted for those amounts provided above. 5% by weight hydrogenated castor oil was substituted for the polyamide thixotropic agent. Additionally, following the cooling step, 10% by weight adipic acid was added.

EQUIVALENTS

From the foregoing detailed description of the specific embodiments of the invention, it should be apparent that a unique flip chip having an integrated flux and underfill has been described. Although particular embodiments have been disclosed herein in detail, this has been done by way of example for purposes of illustration only, and is not intended to be limiting with respect to the scope of the appended claims which follow. In particular, it is contemplated by the inventor that various substitutions, alterations, and modifications may be made to the invention without departing from the spirit and scope of the invention as defined by the claims.

What is claimed is:

1. An integrated circuit assembly which comprises:
    a) an integrated circuit substrate having a top surface and an electrical contact surface, the electrical contact surface having a plurality of solderable contact sites on a surface thereof;
    b) a plurality of solder bumps positioned on the electrical contact surface of the substrate such that each of the solderable contact sites has one solder bump associated therewith, the solder bumps being affixed to the solderable contact sites; and
    c) a thermoplastic underfill material applied to the electrical contact surface of the integrated circuit substrate prior to positioning the assembly on a circuit board, the thermoplastic underfill material at least occupying a space defined between each of the solder bumps and characterized in that, upon heating to a solder reflow temperature, at least a portion of the underfill material acts as a solder flux.

2. The integrated circuit assembly of claim 1 wherein the substrate comprises a semiconductor wafer.

3. The integrated circuit assembly of claim 2 wherein the substrate comprises a semiconductor chip.

4. The integrated circuit assembly of claim 3 wherein the substrate comprises a flip chip.

5. The integrated circuit assembly of claim 1 wherein the underfill material covers substantially all of each solder bump.

6. The integrated circuit assembly of claim 1 wherein the underfill material comprises an epoxy resin and a material selected from the group consisting of carboxylic acids, anhydrides and combinations thereof.

7. The integrated circuit assembly of claim 6 wherein the underfill material comprises an epoxy resin and a material selected from the group consisting of adipic acids and cyclohexane dicarboxylic acids.

8. The integrated circuit assembly of claim 1 wherein the underfill material is reworkable.

9. The integrated circuit assembly of claim 1 wherein the thermoplastic material is selected from the group consisting of phenoxy resins, acrylic resins, methacrylic resins, polycarbonate resins, polyamide resins, polybutene resins, polyester resins, polyolefin resins and mixtures thereof.

* * * * *